US010789979B2

United States Patent
Tachibana et al.

(10) Patent No.: US 10,789,979 B2
(45) Date of Patent: Sep. 29, 2020

(54) MAGNETIC RECORDING MEDIUM (71) Applicant: SONY CORPORATION, Tokyo (JP)

(72) Inventors: Junichi Tachibana, Miyagi (JP); Tetsuo Endo, Miyagi (JP); Tomoe Ozaki, Miyagi (JP); Takashi Aizawa, Miyagi (JP)

(73) Assignee: Sony Corporation, Tokyo (JP)

( * ) Notice: Subject to any disclaimer, the term of this patent is extended or adjusted under 35 U.S.C. 154(b) by 301 days.

(21) Appl. No.: 15/765,600

(22) PCT Filed: Nov. 16, 2016

(86) PCT No.: PCT/JP2016/004903
§ 371 (c)(1),
(2) Date: Apr. 3, 2018

(87) PCT Pub. No.: WO2017/085931
PCT Pub. Date: May 26, 2017

(65) Prior Publication Data
US 2019/0080712 A1    Mar. 14, 2019

(30) Foreign Application Priority Data
Nov. 17, 2015 (JP) ................. 2015-225006

(51) Int. Cl.
*G11B 5/667* (2006.01)
*G11B 5/725* (2006.01)
(Continued)

(52) U.S. Cl.
CPC .......... *G11B 5/667* (2013.01); *C23C 14/0021* (2013.01); *G11B 5/65* (2013.01); *G11B 5/725* (2013.01); *G11B 5/7325* (2013.01)

(58) Field of Classification Search
CPC .......... G11B 5/73; G11B 5/733; G11B 5/7325
See application file for complete search history.

(56) References Cited

U.S. PATENT DOCUMENTS

| 8,488,276 B1 * | 7/2013 | Jung ................... G11B 5/7325 29/603.13 |
| 2002/0015865 A1 | 2/2002 | Segawa et al. |
| 2008/0096055 A1 | 4/2008 | Takenoiri et al. |

FOREIGN PATENT DOCUMENTS

| JP | 2001-256640 A | 9/2001 |
| JP | 2002-083420 A | 3/2002 |

(Continued)

OTHER PUBLICATIONS

International Search report issued in connection with International Patent Application No. PCT/JP2016/004903, dated Jan. 31, 2017. (2 pages).

*Primary Examiner* — Holly C Rickman
(74) *Attorney, Agent, or Firm* — K&L Gates LLP (57) ABSTRACT

A magnetic recording medium includes: an elongated substrate having flexibility; a first layer, being provided on the substrate, containing Cr, Ni, and Fe, and having a face-centered cubic lattice structure with a (111) plane preferentially oriented so as to be parallel to a surface of the substrate; a second layer, being provided on the first layer, containing Co and O, having a ratio of an average atomic concentration of O to an average atomic concentration of Co of 1 or more, and having a column structure with an average particle diameter of 3 nm or more and 13 nm or less; a third layer, being provided on the second layer, and containing Ru; and a perpendicular recording layer, being provided on the third layer.

12 Claims, 2 Drawing Sheets

(51) Int. Cl.
*G11B 5/73* (2006.01)
*C23C 14/00* (2006.01)
*G11B 5/65* (2006.01)

(56) References Cited

FOREIGN PATENT DOCUMENTS

| | | |
|---|---|---|
| JP | 2005-196885 A | 7/2005 |
| JP | 2006-202373 A | 8/2006 |
| JP | 2008-117506 A | 5/2008 |
| WO | 2016/185695 A1 | 11/2016 |

* cited by examiner

MAGNETIC RECORDING MEDIUM

CROSS-REFERENCE TO RELATED APPLICATIONS

The present application claims the benefit of International Application No. PCT/JP2016/004903, filed Nov. 16, 2016, which claims priority to Japanese Application No. 2015-225006, filed Nov. 17, 2015, the disclosures of which are incorporated herein by reference.

BACKGROUND

The present technology relates to a magnetic recording medium. For more details, the present technology relates to a magnetic recording medium provided with a perpendicular recording layer.

In recent years, due to the development of information technology (IT) society, the digitization in libraries, archives, and the like, and the long-term storage of business documents, there has been an increasing demand for increasing the capacity of a magnetic recording medium for data storage. In order to respond to such a demand, a magnetic recording medium provided with a perpendicular recording layer has been proposed.

For example, in Patent Document 1, as the magnetic recording medium described above, a magnetic recording medium in which at least an amorphous layer, a seed layer, a base layer, a magnetic layer, and a protective layer are sequentially formed on a non-magnetic support has been disclosed.

SUMMARY

Problems to be Solved by the Invention

An object of the present technology is to provide a magnetic recording medium having a high signal/noise ratio (SNR).

Solutions to Problems

In order to solve the above issue, the present technology is a magnetic recording medium including: an elongated substrate having flexibility; a first layer, being provided on the substrate, containing Cr, Ni, and Fe, and having a face-centered cubic lattice structure with a (111) plane preferentially oriented so as to be parallel to a surface of the substrate; a second layer, being provided on the first layer, containing Co and O, having a ratio of an atomic concentration of O to an average atomic concentration of Co of 1 or more, and having a column structure with an average particle diameter of 3 nm or more and 13 nm or less; a third layer, being provided on the second layer, and containing Ru; and a perpendicular recording layer, being provided on the third layer.

Effects of the Invention

As described above, according to the present technology, magnetic recording medium having a high SNR can be provided.

DETAILED DESCRIPTION

With reference to drawings, embodiments of the present technology will be described in the following order. Note that in all of the drawings of the following embodiments, identical or corresponding parts are denoted by the same reference numerals.

Embodiments of the present technology will be described in the following order.
1 Constitution of magnetic recording medium
2 Configuration of sputtering device
3 Method for producing magnetic recording medium
4 Effects
5 Modification Examples

1 CONSTITUTION OF MAGNETIC RECORDING MEDIUM

Figure 1:
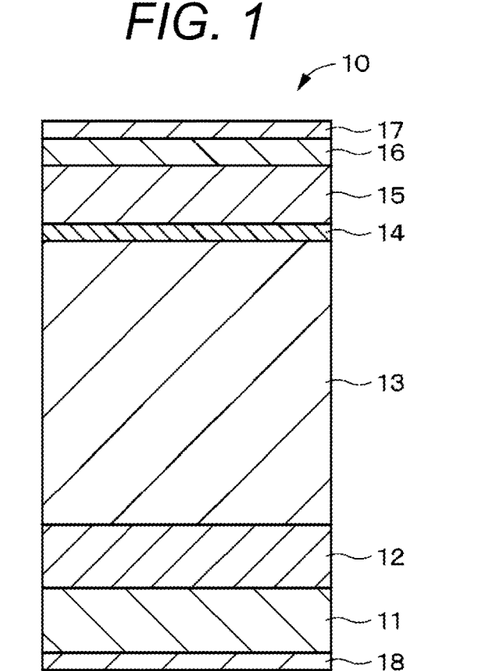
FIG. 1 is a sectional view schematically showing one example of constitution of a magnetic recording medium according to one embodiment of the present technology.

A magnetic recording medium 10 according to one embodiment of the present technology is a so-called elongated single-layer perpendicular magnetic recording medium, and as shown in FIG. 1, the magnetic recording medium 10 is provided with a substrate 11, a seed layer (first layer) 12 disposed on a main surface on one side (hereinafter, also referred to as "surface") of the substrate 11, a base layer (second layer) 13 disposed on the seed layer 12, an intermediate layer (third layer) 14 disposed on the base layer 13, and a recording layer 15 disposed on the intermediate layer 14. The magnetic recording medium 10 may be further provided with a protective layer 16 disposed on the recording layer 15, a lubricant layer 17 disposed on the protective layer 16, and a back coat layer 18 disposed on a main surface on the other side (hereinafter, also referred to as "back surface") of the substrate 11, as needed.

Note that in the present specification, a magnetic recording medium having no soft magnetic underlayer (hereinafter, referred to as "SUL") is referred to as a "single-layer perpendicular magnetic recording medium", and a magnetic recording medium having an SUL is referred to as a "double-layer perpendicular magnetic recording medium".

The magnetic recording medium 10 according to one embodiment is suitable for use as a storage medium for data archiving that is expected to be demanded more and more in the future. For example, with the magnetic recording medium 10, a surface recording density 10 times or more the current coated-type magnetic recording medium for storage, that is, a surface recording density of 50 Gb/in$^2$ can be realized. In a case where a data cartridge with a general linear recording system is constituted using a magnetic recording medium 10 having such a surface recording density, a large capacity recording of 50 TB or more per reel of data cartridge can be realized. The magnetic recording medium 10 is suitable for use in a recording and reproducing device that uses a ring-type recording head and a giant magnetoresistive (GMR) type reproducing head.

(Substrate)

The substrate 11 serving as a support is an elongated non-magnetic substrate having flexibility. The non-magnetic substrate is a film, and the thickness of the film is, for example, 3 µm or more and 8 µm or less. As the material for the substrate 11, for example, a flexible polymer resin material used for a general magnetic recording medium may be used. Specific examples of the polymer material as described above include polyesters, polyolefins, a cellulose derivative, a vinyl-based resin, polyimides, polyamides, and polycarbonate.

(Seed Layer)

The seed layer 12 contains Cr, Ni, and Fe, and has a face-centered cubic lattice (fcc) structure with a (111) plane preferentially oriented so as to be parallel to a surface of the substrate 11. Herein, the expression "preferentially oriented" means a state in which the diffraction peak intensity from a (111) plane of a face-centered cubic lattice structure is larger than the diffraction peaks from other crystal planes in a θ-2θ scan of an X-ray diffraction method, or a state in which only the diffraction peak intensity from a (111) plane of a face-centered cubic lattice structure is observed in a θ-2θ scan of an X-ray diffraction method.

From the viewpoint of improving the SNR, the X-ray diffraction intensity ratio of the seed layer 12 is preferably 60 cps/nm or more, more preferably 70 cps/nm or more, and furthermore preferably 80 cps/nm or more. Herein, the X-ray diffraction intensity ratio of the seed layer 12 is a value (I/D (cps/nm)) obtained by dividing the X-ray diffraction intensity I (cps) of the seed layer 12 by the thickness D (nm) of the seed layer 12.

The Cr, Ni and Fe contained in the seed layer 12 preferably have an average composition represented by the following formula (A).

$$Cr_X(Ni_YFe_{100-Y})_{100-X} \quad (A)$$

(where X is in the range of 10≤X≤45, and Y is in the range of 60≤Y≤90.)

If X is outside the above range, the (111) orientation of the face-centered cubic lattice structure of Cr, Ni, and Fe decreases, and the SNR tends to be deteriorated. Similarly, if Y is outside the above range, the (111) orientation of the face-centered cubic lattice structure of Cr, Ni, and Fe decreases, and the SNR tends to be deteriorated.

The thickness of the seed layer 12 is preferably 5 nm or more and 40 nm or less. If the thickness of the seed layer 12 is outside the above range, the (111) orientation of the face-centered cubic lattice structure of Cr, Ni, and Fe decreases, and the SNR tends to be deteriorated.

(Base Layer)

The base layer 13 contains Co and O having a face-centered cubic lattice structure, and has a column (columnar crystal) structure. In the base layer 13 containing Co and O, an effect (function) substantially similar to that of the intermediate layer 14 containing Ru is obtained. The concentration ratio of the average atomic concentration of O to the average atomic concentration of Co ((average atomic concentration of O)/(average atomic concentration of Co)) is 1 or more. If the concentration ratio is less than 1, the effect of providing the base layer 13 is deteriorated, and the SNR tends to be lowered. Further, the base layer 13 may be a layer of a column (columnar crystal) structure containing Ni and O having a face-centered cubic lattice structure.

From the viewpoint of improving the SNR, the column structure is preferably inclined. The direction of the inclination is preferably the longitudinal direction of the elongated magnetic recording medium 10. The reason why the longitudinal direction is preferred as described above is as follows. The magnetic recording medium 10 according to the present embodiment is a so-called magnetic recording medium for linear recording, and the recording track is parallel to the longitudinal direction of the magnetic recording medium 10. Further, the magnetic recording medium 10 according to the present embodiment is also a so-called perpendicular magnetic recording medium, and from the viewpoint of the recording characteristics, the crystal orientation axis of the recording layer 15 is preferably in the perpendicular direction, however, due to the influence of the inclination of the column structure of the base layer 13, there may be a case where inclination of the crystal orientation axis of the recording layer 15 occurs. In the magnetic recording medium 10 for linear recording, in view of the relationship with the head magnetic field during recording, the influence on the recording characteristics due to the inclination of the crystal orientation axis in the constitution in which the crystal orientation axis of the recording layer 15 is inclined in the longitudinal direction of the magnetic recording medium 10 can be more reduced as compared with the constitution in which the crystal orientation axis of the recording layer 15 is inclined in the width direction of the magnetic recording medium 10. In order to incline the crystal orientation axis of the recording layer 15 in the longitudinal direction of the magnetic recording medium 10, the inclination direction of the column structure of the base layer 13 is preferably in the longitudinal direction of the magnetic recording medium 10, as described above.

The inclination angle of the column structure is preferably larger than 0° or 60° less. If the inclination angle is in the range of larger than 0° and 60° or less, the shape of the tip of the column included in the base layer 13 is largely changed and becomes substantially a triangle shape, therefore, the effect of the granular structure is enhanced, the noise is reduced, and the SNR tends to be improved. On the other hand, if the inclination angle exceeds 60°, the shape of the tip of the column included in the base layer 13 is less changed and hardly becomes substantially a triangle shape, therefore, the low noise effect tends to be reduced.

The average particle diameter of the column structure is 3 nm or more and 13 nm or less. If the average particle diameter is less than 3 nm, the average particle diameter of the column structure included in the recording layer 15 becomes small, therefore, the ability to retain the record tends to be remarkably lowered with the current magnetic material. On the other hand, if the average particle diameter exceeds 13 nm, the noise is increased, and the SNR tends to be lowered.

The thickness of the base layer 13 is preferably 10 nm or more and 150 nm or less. If the thickness of the base layer 13 is less than 10 nm, the (111) orientation of the face-centered cubic lattice structure of the base layer 13 tends to be lowered. On the other hand, if the thickness of the base layer 13 exceeds 150 nm, the particle diameter of the column becomes large and the noise is increased, therefore, the SNR tends to be lowered.

(Intermediate Layer)

The intermediate layer 14 preferably has a crystal structure similar to that of the recording layer 15. In a case where the recording layer 15 contains a Co-based alloy, the intermediate layer 14 contains a material having a hexagonal close-packed (hcp) structure similar to that of the Co-based alloy, the c-axis of the structure is preferably oriented in the direction perpendicular to the layer surface (that is, the thickness direction). This is because the orientation of the recording layer 15 can be enhanced, and further the matching of lattice constants between the intermediate layer 14 and the recording layer 15 can be made comparatively favorable. As the material having a hexagonal close-packed structure, a material containing Ru is preferably used, and specifically, Ru alone, or an Ru alloy is preferred. As the Ru alloy, for example, an Ru alloy oxide such as Ru—$SiO_2$, Ru—$TiO_2$, or Ru—$ZrO_2$ can be mentioned.

The thickness of the intermediate layer 14 may be thinner than that of the intermediate layer in a general magnetic recording medium, and can be, for example, 1 nm or more and 5 nm or less. Since the seed layer 12 and the base layer 13 having the above-described configurations, respectively are provided under the intermediate layer 14, even if the thickness of the intermediate layer 14 is thin as described above, a favorable SNR can be obtained.

(Recording Layer)

The recording layer 15 is a so-called perpendicular magnetic recording layer, and is preferably a granular magnetic layer containing a Co-based alloy from the viewpoint of improving the recording density. This granular magnetic layer is constituted of ferromagnetic crystal grains containing Co-based alloy, and non-magnetic grain boundaries (non-magnetic material) surrounding the ferromagnetic crystal grains. More specifically, this granular magnetic layer is constituted of columns (columnar crystals) containing a Co-based alloy, and non-magnetic grain boundaries (for example, an oxide such as $SiO_2$) surrounding the columns to separate magnetically each of the columns. With this structure, the recording layer 15 having a structure in which each of the columns is magnetically separated can be constituted.

The Co-based alloy has a hexagonal close-packed (hcp) structure, and the c-axis is oriented in the direction perpendicular to the layer surface (thickness direction). As the Co-based alloy, a CoCrPt-based alloy containing at least Co, Cr, and Pt is preferably used. The CoCrPt-based alloy is not particularly limited, and the CoCrPt alloy may further contain an additional element. As the additional element, for example, one or more kinds of elements selected from the group consisting of Ni, Ta, and the like can be mentioned.

The non-magnetic grain boundaries surrounding ferromagnetic crystal grains contain a non-magnetic metal material. Herein, a metal contains a semimetal. As the non-magnetic metal material, for example, at least one of a metal oxide and a metal nitride can be used, and from the viewpoint of maintaining the granular structure more stably, a metal oxide is preferably used. As the metal oxide, a metal oxide containing at least one or more kinds of elements selected from the group consisting of Si, Cr, Co, Al, Ti, Ta, Zr, Ce, Y, Hf, and the like can be mentioned. A metal oxide containing at least a Si oxide (that is, $SiO_2$) is preferred. As the specific example, $SiO_2$, $Cr_2O_3$, CoO, $Al_2O_3$, $TiO_2$, $Ta_2O_5$, $ZrO_2$, $HfO_2$, or the like can be mentioned. As the metal nitride, a metal nitride containing at least one or more kinds of elements selected from the group consisting of Si, Cr, Co, Al, Ti, Ta, Zr, Ce, Y, Hf, and the like can be mentioned. As the specific example, SiN, TiN, AlN, or the like can be mentioned.

It is preferred that the CoCrPt-based alloy contained in ferromagnetic crystal grains and the Si oxide contained in non-magnetic grain boundaries have an average composition shown in the foil owing formula (B). This is because the influence of the demagnetizing field is suppressed, and further the saturation magnetization (Ms) with which sufficient reproduction output can be secured can be realized, and as a result, further improvement of the recording and reproducing characteristics can be realized.

$$(Co_xPt_yCr_{100-x-y})_{100-z}\text{—}(SiO_2)_z \quad (B)$$

(where in formula (B), x, y, and z each are values in the ranges of 69≤X≤75, 10≤y≤16, and 9≤Z≤12.)

In addition, the above composition can be determined as follows. While ion milling from the protective layer 16 side of the magnetic recording medium 10, analysis (depth profile measurement) in the depth direction of the recording layer 15 by Auger electron spectroscopy (hereinafter, referred to as "AES") is performed, and the average composition (average atomic ratio) of Co, Pt, Cr, Si, and O in the thickness direction is determined.

(Protective Layer)

The protective layer 16 contains, for example, a carbon material or a silicon dioxide ($SiO_2$), and from the viewpoint of the layer strength of the protective layer 16, the protect layer 16 preferably contains a carbon material. Examples of the carbon material include graphite, diamond-like carbon (DLC), and diamond.

(Lubricant Layer)

The lubricant layer 17 contains at least one kind of a lubricant. The lubricant layer 17 may further contain various kinds of additive agents, for example, a rust-preventive, agent, as needed. The lubricant has at least two carboxyl groups and one ester bond, and contains at least one kind of the carboxylic acid-based compound represented by the following general formula (1). The lubricant may further contain a lubricant other than the kind of the carboxylic acid-based compound represented by the following general formula (1).

General formula (1):

[Chemical formula 1]

(where Rf is an unsubstituted or substituted, or saturated or unsaturated, fluorine-containing hydrocarbon group or hydrocarbon group, Es is an ester bond, and R may not be present, or is an unsubstituted or substituted, or saturated or unsaturated hydrocarbon group.)

The above carboxylic acid-based compound is preferably one represented by the following general formula (2) or (3).

General formula (2):

[Chemical formula 2]

(where Rf is an unsubstituted or substituted, or saturated or unsaturated, fluorine-containing hydrocarbon group or hydrocarbon group.)

General formula (3):

[Chemical formula 3]

$$Rf-O-\underset{\underset{O}{\|}}{C}-CH_2-\underset{\underset{CH_2-COOH}{|}}{CH}-COOH$$

(where Rf is an unsubstituted or substituted, or saturated or unsaturated, fluorine-containing hydrocarbon group or hydrocarbon group.)

The lubricant preferably contains one or both of the carboxylic acid compounds represented by the above general formulas (2) and (3).

If a lubricant containing a carboxylic acid-based compound represented by the general formula (1) is applied to the recording layer 15, the protective layer 16, or the like, a lubricating effect is developed by the cohesive force between Rfs of the fluorine-containing hydrocarbon group or hydrocarbon group being a hydrophobic group. In a case where the Rf group is a fluorine-containing hydrocarbon group, the total number of carbon atoms is 6 to 50, and further the total number of carbon atoms of the fluorinated hydrocarbon group is 4 to 20, preferably. The Rf group may be saturated or unsaturated, a linear or branched chain, or cyclic, and is particularly preferably a saturated linear chain.

For example, in a case where the Rf group is a hydrocarbon group, a group represented by the following general formula (4) is desired.

General formula (4):

[Chemical formula 4]

$$CH_3-(CH_2)_l-$$

(where in the general formula (4), l is an integer selected from the range of 8 to 30, and more desirably an integer selected from the range of 12 to 20.)

In addition, in a case where the Rf group is a fluorine-containing hydrocarbon group, a group represented by the following general formula (5) is desired.

General formula (5):

[Chemical formula 5]

$$CF_3-(CF_2)_n-(CH_2)_m-$$

(where in the general formula (5) m and n each are an integer selected from the following range: m=2 to 20, and n=3 to 18, and more desirably m=4 to 13, and n=3 to 10.)

The fluorinated hydrocarbon group may be concentrated in one place as described above, may be dispersed as in the following general formula (6), or may be not only —CF₃ or —CF₂—, but also —CHF₂, —CHF—, or the like.

General formula (6):

[Chemical formula 6]

$$CF_3-(CF_2)_{n1}-(CH_2)_{m1}-(CF_2)_{n2}-(CH_2)_{m2}$$

(where in general formula (6), n1+n2=n, m1+m2=m.)

The reason why the number of carbon atoms in the general formulas (4), (5), and (6) is limited as described above is because if the number of carbon atoms (l, or the sum of m and n) constituting the alkyl group or the fluorine-containing alkyl group is the above lower limit or more, the length becomes an appropriate length, and the cohesive force among the hydrophobic groups is effectively exerted, a favorable lubricating effect is developed, and friction/abrasion durability is improved; and further, because if the number of carbon atoms is the above upper limit or less, the solubility of the lubricant including the above carboxylic acid-based compound to a solvent is maintained favorable.

In particular, if the Rf group contains a fluorine atom, there is an effect on the reduction in friction coefficient, further on the improvement in runnability, and the like. However, it is favorable that a hydrocarbon group is provided between the fluorine-containing hydrocarbon group and the ester bond to separate the fluorine-containing hydrocarbon group and the ester bond, and the stability of the ester bond is secured to prevent hydrolysis.

Further, the Rf group may also be a group having a fluoroalkyl ether group, or a perfluoropolyether group.

The R group may not be present, but if the R group is present, it is favorable that the R group is a hydrocarbon chain having a relatively small number of carbon atoms.

In addition, the Rf group or the R group contains an element such as nitrogen, oxygen, sulfur, phosphorus, or halogen as a constituent element, and may further have a hydroxyl group, a carboxyl group, a carbonyl group, an amino group, an ester bond, or the like in addition to the functional groups described above.

Specifically, the carboxylic acid-based compound represented by the general formula (1) is, preferably at least one kind of a compound shown below. That is, the lubricant preferably contains at least one kind of the compounds shown below.

$CF_3(CF_2)_7(CH_2)_{10}COOH$
$CF_3(CF_2)_3(CH_2)_{10}COOH$
$C_{17}H_{35}COOCH(COOH)CH_2COOH$
$CF_3(CF_2)_7(CH_2)_2OCOCH_2CH(C_{18}H_{37})COOCH(COOH)CH_2COOH$
$CF_3(CF_2)_7COOCH(COOH)CH_2COOH$
$CHF_3(CF_2)_7COOCH(COOH)CH_2COOH$
$CF_3(CF_2)_7(CH_2)_2OCOCH_2CH(COOH)CH_2COOH$
$CF_3(CF_2)_7(CH_2)_6OCOCH_2CH(COOH)CH_2COOH$
$CF_3(CF_2)_7(CH_2)_{11}OCOCH_2CH(COOH)CH_2COOH$
$CF_3(CF_2)_3(CH_2)_6OCOCH_2CH(COOH)CH_2COOH$
$C_{18}H_{37}OCOCH_2CH(COOH)CH_2COOH$
$CF_3(CF_2)_7(CH_2)_4COOCH(COOH)CH_2COOH$
$CF_3(CF_2)_3(CH_2)_4COOCH(COOH)CH_2COOH$
$CF_3(CF_2)_3(CH_2)_7COOCH(COOH)CH_2COOH$
$CF_3(CF_2)_9(CH_2)_{10}COOCH(COOH)CH_2COOH$
$CF_3(CF_2)_7(CH_2)_{12}COOCH(COOH)CH_2COOH$
$CF_3(CF_2)_5(CH_2)_{10}COOCH(COOH)CH_2COOH$
$CF_3(CF_2)_7CH(C_9H_{19})CH_2CH=CH(CH_2)_7COOCH(COOH)CH_2COOH$
$CF_3(CF_2)_7CH(C_6H_{13})(CH_2)_7COOCH(COOH)CH_2COOH$
$CH_3(CH_2)_3(CH_2CH_2CH(CH_2CH_2(CF_2)_9CF_3))_2(CH_2)_7COOCH(COOH)CH_2COOH$

The carboxylic acid-based compound represented by the general formula (1) is soluble in a non-fluorine-based solvent giving a small load to the environment, and has an advantage that using a general-purpose solvent such as a hydrocarbon-based solvent, a ketone-based solvent, an alcohol-based solvent, or an ester-based solvent, a process such as coating, dipping, or spraying can be performed. Specifically, a solvent such as hexane, heptane, octane, decane dodecane, benzene, toluene, xylene, cyclohexane, methyl ethyl ketone, methyl isobutyl ketone, methanol, ethanol, isopropanol, diethyl ether, tetrahydrofuran, dioxane, or cyclohexanone can be mentioned.

In a case where the protective layer 16 contains a carbon material, if the above carboxylic acid-based compound is applied on the protective layer 16 as a lubricant, two carboxyl groups being polar group moieties of the lubricant molecule and at least one ester bond group are adsorbed on the protective layer 16, and a lubricant layer 17 particularly having favorable durability can be formed by the cohesive force among the hydrophobic groups.

In this regard, as described above, the lubricant is not only retained as the lubricant layer 17 on a surface of the magnetic recording medium 10, but also may be contained and retained in a layer such as a recording layer 15, and a protective layer 16, the layer constituting the magnetic recording medium 10.

(Back Coat Layer)

The back coat layer 18 contains, for example, a binder, inorganic particles, and a lubricant. The back coat layer 18 may also contain various kinds of additive agents such as a curing agent, and an antistatic agent, as needed.

2 CONFIGURATION OF SPUTTERING DEVICE

Figure 2:
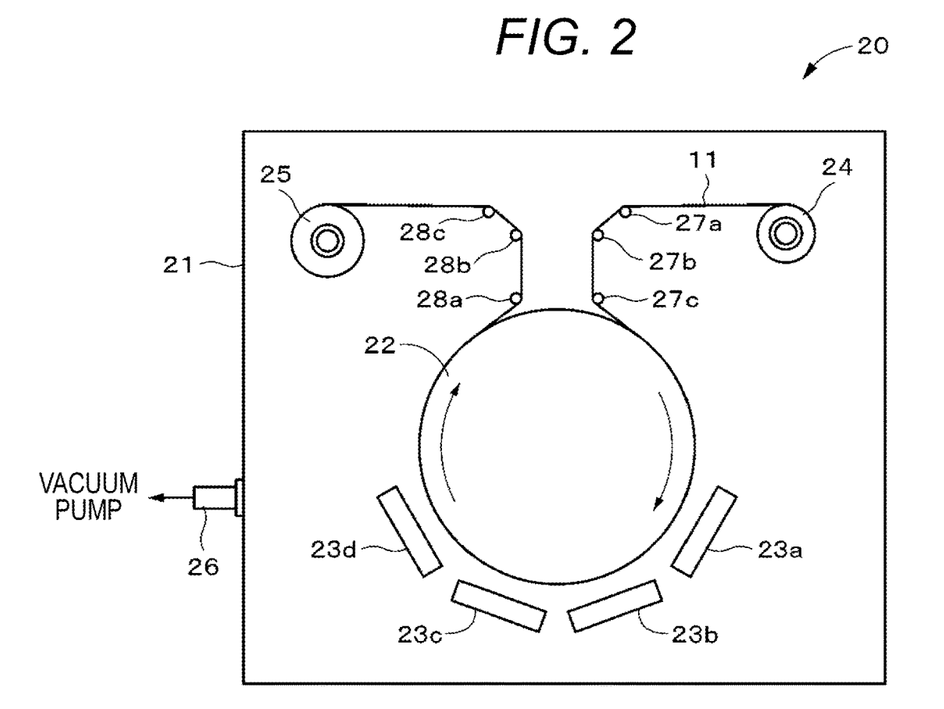
FIG. 2 is a schematic view schematically showing one example of configuration of a sputtering device used for producing the magnetic recording medium according to one embodiment of the present technology.

Hereinafter, with reference to FIG. 2, one example of configuration of a sputtering device 20 used for producing the magnetic recording medium 10 according to one embodiment of the present technology will be described. This sputtering device 20 is a continuous take-up type sputtering device used for forming a seed layer 12, a base layer 13, an intermediate layer 14, and a recording layer 15, and is, as shown in FIG. 2, provided with a film-forming chamber 21, a drum 22 being a metal can (rotating body), cathodes 23a to 23d, a supply reel 24, a take-up reel 25, and multiple guide rolls 27a to 27c, and 28a to 28c. The sputtering device 20 is, for example, a device employing a direct current (DC) magnetron sputtering system, however, the sputtering system to be employed herein is not limited to the DC magnetron sputtering system.

The film-forming chamber 21 is connected to a vacuum pump (not shown) via an exhaust port 26, and the atmosphere in the film-forming chamber 21 is set to a predetermined degree of vacuum by the vacuum pump. Inside the film-forming chamber 21, a drum 22 having a rotatable configuration, a supply reel 24, and a take-up reel 25 are arranged. Inside the film-forming chamber 21, multiple guide rolls 27a to 27c for guiding the transportation of the substrate 11 between the supply reel 24 and the drum 22 are provided, and further multiple de rolls 28a to 28c for guiding the transportation of the substrate 11 between the drum 22 and the take-up reel 25 are provided. During sputtering, the substrate 11 drawn from the supply reel 24 is taken up by the take-up reel 25 via the guide rolls 27a to 27c, the drum 22, and the guide rolls 28a to 28c. The drum 22 has a cylindrical shape, and the elongated substrate 11 is transported along the cylindrical circumferential surface of the drum 22. In the drum 22, a cooling mechanism (not shown) is provided, and cooling is conducted to reach, for example, around −20° C. during sputtering. Inside the film-forming chamber 21, multiple cathodes 23a to 23d are arranged so as to be opposite to the circumferential surface of the drum 22. Targets are set for these cathodes 23a to 23d, respectively. Specifically, targets for forming a seed layer 12, a base layer 13, an intermediate layer 14, and a recording layer 15 are set for the cathodes 23a to 23d, respectively. By these cathodes 23a to 23d, multiple kinds of layers, that is, a seed layer 12, a base layer 13, an intermediate layer 14, and a recording layer 15 are formed at the same time.

In the sputtering device 20 having the configuration described above, a seed layer 12, a base layer 13, an intermediate layer 14, and a recording layer 15 can be continuously formed by a roll-to-roll method.

3 METHOD FOR PRODUCING MAGNETIC RECORDING MEDIUM

For example, the magnetic recording medium 10 according to one embodiment of the present technology can be produced as follows.

At first, using a sputtering device 20 as shown in FIG. 2, a seed layer 12, a base layer 13, an intermediate layer 14, and a recording layer 15 are formed on a surface of a substrate 11. Specifically, the layers are formed as follows Firstly, the film-forming chamber 21 is evacuated until the pressure of the inside reaches a predetermined pressure. After that, while introducing a process gas such as Ar gas into the film-forming chamber 21, the targets set for the cathodes 23a to 23d are sputtered. In this way, a seed layer 12, a base layer 13, an intermediate layer 14, and a recording layer 15 are sequentially formed on a surface of a running substrate 11.

The atmosphere in the film-forming chamber 21 during sputtering is, for example, set to around $1 \times 10^{-5}$ Pa to $5 \times 10^{-5}$ Pa. The thickness and characteristics (for example, magnetic characteristics) of a seed layer 12, a base layer 13, an intermediate layer 14, and a recording layer 15 can be controlled by adjusting the tape line speed at which a substrate 11 is taken up, the pressure of a process gas such as Ar gas to be introduced during sputtering (sputtering gas pressure), the input power, or the like.

Next, a protective layer 16 is formed on the recording layer 15. As the method for forming the protective layer 16, for example, a chemical vapor deposition (CVD) method, or a physical vapor deposition (PVD) method may be used.

Next, a binder, inorganic particles, a lubricant, and the like are kneaded and dispersed in a solvent to prepare a coating material for forming a back coat layer. Subsequently, the coating material for forming a back coat layer is applied on a back surface of the substrate 11, and dried to form a back coat layer 18 on the back surface of the substrate 11.

Next, for example, a lubricant is applied on the protective layer 16 to form a lubricant layer 17. As a method for applying the lubricant, for example, various kinds of applying methods such as gravure coating, and dip coating can be used. Subsequently, the magnetic recording medium 10 is cut out to have a predetermined width, as needed. As a result, the magnetic recording medium 10 shown in FIG. 1 is obtained.

4 EFFECTS

The magnetic recording medium 10 according to one embodiment as described above is provided with a seed layer 12 and a base layer 13 between a substrate 11 and an intermediate layer 14. The seed layer 12 contains Cr, Ni, and Fe, and has a face-centered cubic lattice structure with a (111) plane preferentially oriented so as to be parallel to a surface of the substrate 11. The base layer 13 contains Co and O, has a ratio of the average atomic concentration of O to the average atomic concentration of Co of 1 or more, and has a column structure with an average particle diameter of 3 nm or more and 13 nm or less. In this way, the thickness of the intermediate layer 14 is reduced, and without using the Ru that is an expensive material as much as possible, a recording layer 15 having a favorable crystal orientation and further having a high coercive force can be realized. Therefore, a magnetic recording medium 10 having a high SNR can be provided.

The Ru contained in the intermediate layer 14 has the same hexagonal close-packed lattice structure as that of the Co that is a main component of the recording layer 15. For this reason, Ru has an effect of achieving both of the improvement of the crystal orientation and the promotion of granularity, in the recording layer 15. In addition, in order to further improve the crystal orientation of the Ru contained in the intermediate layer 14, a base layer 13 and a seed layer 12 are provided under the intermediate layer 14. In the magnetic recording medium 10 according to one embodiment, an effect (function) substantially similar to that of the intermediate layer 14 containing Ru s realized with the base layer 13 containing inexpensive CoO having a face-centered cubic lattice structure. For this reason, the thickness of the intermediate layer 14 can be made thin. Further, in order to improve the crystal orientation of the base layer 13, a seed layer 12 containing Cr, Ni, and Fe is provided.

5 MODIFICATION EXAMPLES

Modification Example 1

Figure 3A:
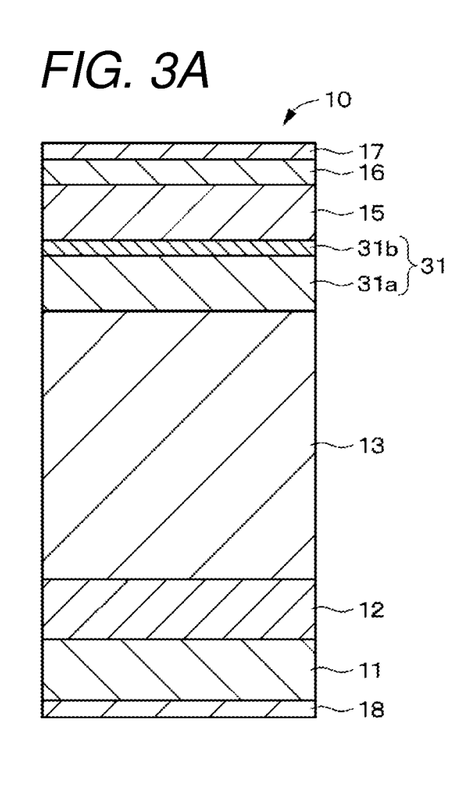
FIG. 3A is a sectional view schematically showing one example of constitution of the magnetic recording medium according to Modification Example 1 of one embodiment of the present technology.

As shown in FIG. 3A, the magnetic recording medium 10 may be provided with an intermediate layer 31 having a double-layer structure on a base layer 13. The intermediate layer 31 is provided with a first intermediate layer 31a disposed on the base layer 13, and a second intermediate layer 31b disposed on the first intermediate layer 31a. The first intermediate layer 31a contains, for example, NiW, NiWZr, NiWAl, or Ta. The second intermediate layer 31b is similar to the intermediate layer 14 in one embodiment as described above.

Modification Example 2

Figure 3B:
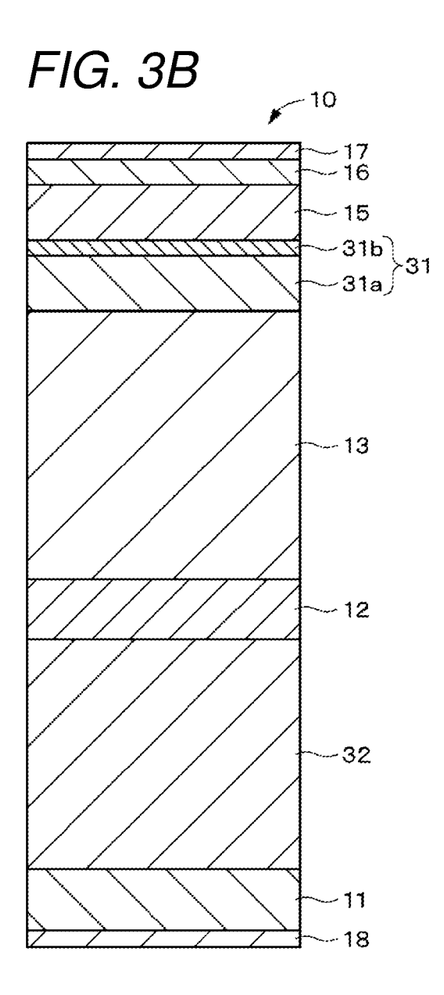
FIG. 3B is a sectional view schematically showing one example of constitution of the magnetic recording medium according to Modification Example 2 of one embodiment of the present technology.

The magnetic recording medium 10 is a so-called double-layer perpendicular magnetic recording medium, and may be further provided with an SUL 32 that is a single layer between a substrate 11 and a seed layer 12, as shown in FIG. 3B. The magnetic recording medium 10 is suitable for use in a recording and reproducing device using a single pole type (BPI) recording head and a tunnel magnetoresistive (TMR) type reproducing head.

The thickness of the SUL 13 is preferably 40 nm or more, more preferably 40 nm or more and 140 nm or less. The SUL 13 contains a soft magnetic material in an amorphous state. As the soft magnetic material, for example, a Co-based material, a Fe-based material, or the like can be used. As the Co-based material, for example, CoZrNb, CoZrTa, CoZr-TaNb, or the like can be mentioned. As the Fe-based material, for example, FeCoB, FeCoZr, FeCoTa, or the like can be mentioned.

In the magnetic recording medium 10 according to Modification Example 2, by providing an SUL 19 under a recording layer 15 that is a perpendicular magnetic layer, the magnetic field strength from a recording head can be increased. Accordingly, the magnetic recording medium 10 suitable for high density recording can be realized.

Modified Example 3

Figure 3C:
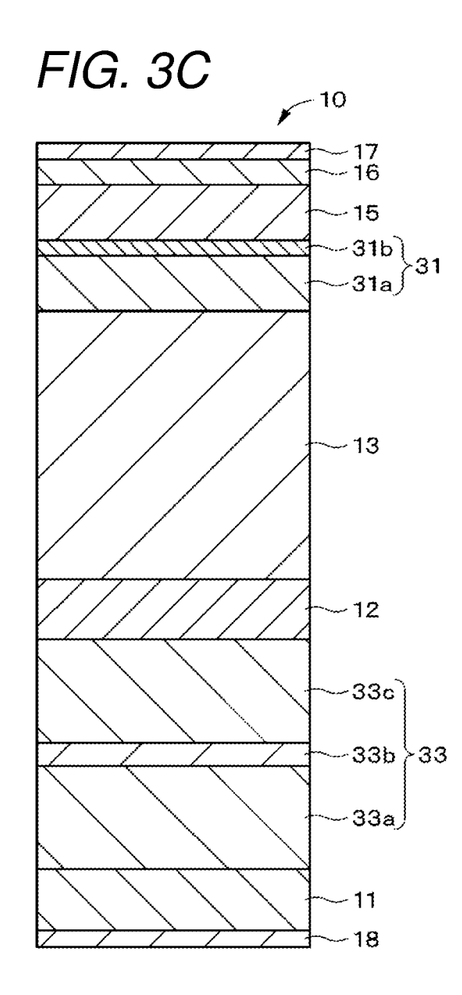
FIG. 3C is a sectional view schematically showing one example of constitution of the magnetic recording medium according to Modification Example 3 of one embodiment of the present technology.

As shown in FIG. 3C, the magnetic recording medium 10 may be provided with an antiparallel coupled SUL (hereinafter, also referred to as "APC-SUL") 33 between a substrate 11 and a seed layer 12.

The APC-SUL 33 has a structure in which two soft magnetic layers 33a and 33c are laminated with a thin intermediate layer 33b therebetween, and are positively coupled with the intermediate layer 33b therebetween using the exchange coupling so that the magnetization directions are made anti-parallel. The soft magnetic layers 33a and 33c preferably have substantially the same thickness as each other. The total thickness of the soft magnetic layers 33a and 33c is preferably 40 nm or more, more preferably 40 nm or more and 140 nm or less. If the total thickness is 40 nm or more, more favorable recording and reproducing characteristics can be obtained. On the other hand, if the total thickness is 140 nm or less, it can be avoided that the layer forming time of the APC-SUL 33 is prolonged and the decrease in productivity is caused. The soft magnetic layers 33a and 33c preferably have the same material as each other, and as the material, a material similar to that of the SUL 32 in Modification Example 2 can be used. The thickness of the intermediate layer 33b is, for example, 0.8 nm or more and 1.4 nm or less, preferably 0.9 nm or more and 1.3 nm or less, and more preferably around 1.1 nm. By selecting the thickness of the intermediate layer 33b within the range of 0.9 nm or more and 1.3 nm or less, more favorable recording and reproducing characteristics can be obtained. As a material for the intermediate layer 33b, V, Cr, Mo, Cu, Ru, Rh, and Re can be mentioned, and particularly a material containing Ru is preferred.

In the magnetic recording medium 10 according to Modification Example 3, since an APC-SUL 33 is used, a soft magnetic layer 33a that is an upper layer part and a soft magnetic layer 33c that is a lower layer part are exchange coupled in antiparallel, and the magnetization amount of the upper and lower layers in total becomes zero in a residual magnetization state. As a result, the generation of spike-like noise that is generated in a case where the magnetic domain in the APC-SUL 33 moves can be suppressed. Accordingly, the recording and reproducing characteristics can further be improved.

Modification Example 4

In one embodiment as described above, a case where a seed layer 12, a base layer 13, an intermediate layer 14, and a recording layer 15 are formed by a sputtering method has beer, described, however, at least one layer of these layers, for example, the base layer 13 maybe formed by a vapor deposition method. In addition, an intermediate layer 31, an SUL 32, and an APC-SUL 33 in the above-described Modification Examples 1 to 3 may be formed by a sputtering method, or by a vapor deposition method.

EXAMPLES

Hereinafter, the present technology is specifically described by way of Examples, however, the present technology is not limited only to these Examples.

In the present Examples, the thickness of each of a seed layer, a base layer, an intermediate layer, a recording layer, and a protective layer was demanded as follows. At first, a magnetic tape was thinly processed in the layer cross-section direction to prepare a sample piece. Next, the sample piece was observed with a transmission electron microscope (hereinafter, referred to as "TEM"), and the thickness of each of the layers was measured from the TEM image.

In addition, in the present Examples, the composition of a seed layer was demanded as follows. Firstly, the magnetic tape was subjected to ion milling, and the ion-milled magnetic tape was analyzed in the depth direction of the seed layer by AES (depth profile measurement). Next, the average composition (average atomic ratio) of Cr, Ni, and Fe in the thickness direction was determined from the obtained depth profile.

Example 1

(Forming Step of Seed Layer)

At first, a seed layer including $Cr_X(Ni_YFe_{100-Y})_{100-X}$ (where X=40, and Y=81) was formed to have a thickness of 10 nm on a surface of a long polymer film as a non-magnetic substrate under the following layer forming conditions.
Layer forming system: DC magnetron sputtering system
Target: CrNiFe target
Gas type: Ar
Gas pressure: 0.25 Pa
Input power: 1.75 W/mm$^2$ (Forming Step of Base Layer)

Next, a base layer including CoO was formed to have a thickness of 50 nm on the seed layer under the following layer forming conditions.
Layer forming system: RF magnetron sputtering system
Target: CoO target
Gas type: Ar
Gas pressure: 1 Pa
Input power: 0.75 W/mm$^2$
Mask: none (Forming Step of Intermediate Layer)

Next, an intermediate layer including Ru was formed to have a thickness of 2 nm on the base layer under the following layer forming conditions.
Layer forming system: DC magnetron sputtering system
Target: Ru target
Gas type: Ar
Gas pressure: 0.5 Pa (Forming Step of Recording Layer)

Next, a magnetic recording layer including (CoCrPt)—(SiO$_2$) was formed to have a thickness of 14 nm on the intermediate layer under the following layer forming conditions.
Layer forming system: DC magnetron sputtering system
Target: (CoCrPt)—(SiO$_2$) target
Gas type: Ar
Gas pressure: 1.5 Pa (Forming Step of Protective Layer)

Next, a protective layer including carbon was formed to have a thickness of 5 nm on the recording layer under the following layer forming conditions.
Layer forming system: DC magnetron sputtering system.
Target: carbon target
Gas type: Ar
Gas pressure: 1.0 Pa (Forming Step of Lubricant Layer)

Next, a lubricant is applied on the protective layer to form a lubricant layer.

(Forming Step of Back Coat Layer)

Next, a coating material for forming a back coat layer was applied on a back surface of the polymer film, and dried to form a back coat layer. As a result, ac intended magnetic tape was obtained.

Examples 2 and 3

Except that the thicknesses of the seed layers were changed to 5 nm, and 40 nm, respectively is the forming step of a seed layer, a magnetic tape was obtained in a similar manner as in Example 1.

Examples 4, 5, and 6

Except that the compositions of the seed layers were changed to $Cr_X(Ni_YFe_{100-Y})_{100-X}$ (where X=40, and Y=60, 70, and 90), respectively in the forming step of a seed layer, a magnetic tape was obtained in a similar manner as in Example 1.

Examples 7 and 8

Except that the compositions of the seed layers were changed to $Cr_X(Ni_YFe_{100-Y})_{100-X}$ (where X=10 and 45, and Y=81) respectively in the forming step of a seed layer, a magnetic tape was obtained in a similar manner as in Example 1.

Example 9

In the forming step of a base layer, a base layer including CoO was formed to have a thickness of 50 nm on the seed layer under the following layer forming conditions.
Layer forming system: vapor deposition system
Incident angle: 90° (provided that the incident angle is as incident angle of a vapor deposition material using the polymer film surface as a reference (0°))
Oxygen introduction amount: 1000 sccm Examples 10 and 11

Except that the thicknesses of the base layers were changed to 100 nm, and 150 nmn, respectively in the forming step of a base layer, a magnetic tape was obtained in a similar manner as in Example 1.

Example 12

Except that the input power was changed to 1.25 W/mm$^2$ in the forming step of a base layer, a magnetic tape was obtained in a similar manner as in Example 1.

Examples 13 and 14

Except that the incident angles were changed to 60° and 70°, respectively in the forming step of a base layer, a magnetic tape was obtained in a similar manner as in Example 9.

Examples 15 and 16

Except that a mask was used, and the mask angles were set to 60° and 70°, respectively in the forming step of a base layer, a magnetic tape was obtained in a similar manner as in Example 1. Further, by adjusting the mask angles to 60° and 70°, respectively, the angles at which sputtered atoms are incident on the polymer film surface were set to around 60° and 70°, respectively. Note that the incident angle is an angle using the polymer film surface as a reference (0°).

Example 17

Except that the following forming step of an intermediate layer was further provided between the forming step of an intermediate layer and the forming step of a magnetic recording layer, a magnetic tape was obtained in a similar manner as in Example 1.
(Forming Step of Intermediate Layer)

An intermediate layer including NiW was formed to have a thickness of 10 nm on the base layer under the following layer forming conditions.
Layer forming system: DC magnetron sputtering system
Target: NiW target.
Gas type: Ar
Gas pressure: 0.5 Pa Example 18

Except that the following forming step of an SUL with a single layer structure was further provided before the forming step of a seed layer, a magnetic tape was obtained in a similar manner as in Example 1.
(Forming step of SUL with single layer structure)

An SUL with a single layer structure including CoZrNb was formed to have a thickness of 20 nm on a surface of a long polymer film under the following layer forming conditions.
Layer forming system: DC magnetron sputtering system.
Target: CoZrNb target
Gas type: Ar
Gas pressure: 0.1 Pa Example 19

Except that the following forming step of an APC-SUL was provided in place of the forming step of an SUL with a single layer structure, a magnetic tape was obtained in a similar manner as in Example 18.
(Forming Step of APC-SUL)

At first, a first soft magnetic layer including CoZrNb was formed to have a thickness of 50 nm on a surface of a long polymer film under the following layer forming conditions.
Layer forming system: DC magnetron sputtering system
Target: CoZrNb target
Gas type: Ar
Gas pressure: 0.1 Pa Next, an intermediate layer including Ru was formed to have a thickness of 1.0 nm on the first soft magnetic layer under the following layer forming conditions.
Layer forming system: DC magnetron sputtering system.
Target: Ru target
Gas type: Ar
Gas pressure: 0.3 Pa Next, a second soft magnetic layer including CoZrNb was formed to have a thickness of 50 nm on the intermediate layer under the following layer forming conditions.
Layer forming system: DC magnetron sputtering system.
Target: CoZrNb target
Gas type: Ar
Gas pressure: 0.1 Pa Comparative Examples 1, 2, 3, and 4

Except that the thicknesses of the seed layers were changed to 2 nm, 4 nm, 45 nm, and 50 nm, respectively in the forming step of a seed layer, a magnetic tape was obtained in a similar manner as in Example 1.

Comparative Example 5

Except that the gas pressure was changed to 1 Pa in the forming step of a seed layer, a magnetic tape was obtained in a similar manner as in Example 1.

Comparative Examples 6 and 7

Except that the compositions of the seed layers were changed to $Cr_X(Ni_YFe_{100-Y})_{100-X}$ (X=5 and 50, and Y=81), respectively in the forming step of a seed layer, a magnetic tape was obtained in a similar manner as in Example 1.

Comparative Examples 8 and 9

Except that the compositions of the seed layers were changed to $Cr_X(Ni_YFe_{100-Y})_{100-X}$ (X=40, and Y=55 and 95) respectively in the forming step of a seed layer, a magnetic tape was obtained in a similar manner as in Example 1.

Comparative Examples 10, 11, and 12

Except that the oxygen introduction amounts were changed to 500 sccm, 700 sccm, and 900 sccm, respectively in the forming step of a base layer, a magnetic tape was obtained in a similar manner as in Example 9.

Comparative Example 13

Except that the thickness of the base layer was changed to 160 nm in the forming step of a base layer, a magnetic tape was obtained in a similar manner as in Example 1.

Comparative Example 14

Except that the gas pressure was changed to 0.5 Pa in the forming step of a base layer, a magnetic tape was obtained in a similar manner as in Example 1.

Comparative Example 15

Except that the input power was changed to 1.5 W/mm$^2$ in the forming step of a base layer, a magnetic tape was obtained in a similar manner as in Example 1.
(Characterization)

For the magnetic tapes obtained in Examples 1 to 19 and Comparative Examples 1 to 15 as (described above, the following evaluations were made.
(Atomic Concentration Ratio of O to Co)

At first, the magnetic tape was subjected to ion milling, the ion-milled magnetic tape was analyzed in the depth direction of a base layer by AES, and the average atom concentration (at (atomic) %) of each of the Co and O atoms in the depth direction was determined. Next, a concentration ratio of the average atomic concentration of O atom to the average atomic concentration of Co atom, ((average atomic concentration of Co atom)/(average atomic concentration of O atom)) was determined.
(Average Particle Diameter)

At first, the magnetic tape was subjected to ion milling to remove the part of from the surface to the intermediate layer, and further the magnetic tape was subjected to ion milling to remove the part of from the back surface side to the seed layer. Subsequently, the remaining layer piece was observed by TEM, 100 particles were randomly selected from the TEM image, and the area S of each particle was obtained. Next, assuming that the cross-sectional shape of the particle is circular, the particle diameter R of each particle was determined from the following equation.

$$R=2\times(S/\pi)^{1/2}$$

Subsequently, the determined particle diameters of 100 particles were simply averaged (arithmetic average) to determine the average particle diameter of the column.

(Inclination Angle of Column)

At first, the magnetic tape was thinly processed in the layer cross-section direction to prepare a sample piece. Next, the sample piece was observed by TEM, and the inclination angle of the column in the base layer was measured from the TEM image. Herein, the inclination angle is an angle measured using the surface (interface) on the seed layer side of the base layer as a reference (0°).

(X-Ray Diffraction Intensity Ratio)

At first, (θ-2θ) characteristics were measured within the layer slope face of the magnetic tape. As a result, a peak was observed at 2θ: 44° (Ni fcc (111 plane)), and it was found that the (111) plane of the face-centered cubic lattice (fcc) structure of Ni was preferentially oriented so as to be parallel to a polymer film surface. Next, a value (I/D) obtained by dividing the peak intensity I at 2θ: 44° (Ni fcc (111 plane)) by the thickness of the seed layer was determined as the X-ray diffraction intensity ratio. Note that as described above, the thickness of the seed layer was determined by observing the prepared sample piece by TEM.

The measurement conditions of the X-ray diffraction intensity are shown in Table 1.

TABLE 1

| | Tohoku Ryokka Rigaku RINT 2000 | |
|---|---|---|
| X-Ray source | Cu Kα (Kα1 and Kα2) | |
| Tube voltage | 40 kV | |
| Tube current | 40 mA | |
| Scan axis | 2 θ/θ | |
| Measurement method | Continuous | |
| Counting unit | cps | |
| Start angle | 35° | |
| End angle | 47° | |
| Sampling width | 0.02° | |
| Scan speed | 2°/min | |
| Divergence slit | 1/6° | |
| Divergence vertical limit slit | 10 mm | |
| Scattering slit | 8 mm | |
| Light-receiving slit | 13 mm | |
| Offset angle | 0° | |
| hkl | 000 | |
| BG conditions | Low angle | 35° |
| | Counting time | 180 seconds |
| | High angle | 47° |
| | Counting time | 180 seconds |
| Control fixed position | Fixed 0° | |
| Detector | High-speed and high-sensitivity detector | |

Note that as the data processing software, the attached peak search software and XRD analysis processing software JADE were used.

(Magnetic Characteristics)

For the magnetic tape, the perpendicular coercivity Hc and the perpendicular squareness ratio Rs were measured by using a vibrating sample magnetometer (VSM).

(Recording and Reproducing Characteristics)

[In a Case of Magnetic Tape Having No SUL]

The recording and reproducing characteristics were evaluated as follows. At first, measurement with a so-called drag tester in which by using a ring-type recording head and a giant magnetoresistive (GMR) type reproducing head, recording and reproducing is conducted by reciprocally vibrating the heads with a piezo stage was performed. Herein, the read track width of the reproducing head was set to 120 nm. Next, the recording wavelength was set to 250 kilo flux changes per inch (kFCI) and the SNR was determined by calculating with a ratio of the zero-to-peak voltage of reproduced waveform to the voltage determined from a value obtained by integrating noise spectra in a band range of 0 kFCI to 500 kFCI.

In general, the minimum SNR required to establish a recording and reproducing system is said to be around 17 dB in a case of the value obtained by the measurement method (so-called broadband SNR) used for the evaluation of recording and reproducing characteristics as described above. In addition, in consideration of the output reduction caused by sliding of a magnetic tape and a magnetic head, or the deterioration of characteristics in practical use, for example, deformation of a magnetic tape, it is desired to further set a SNR margin. In consideration of the margin, it is considered that the SNR is preferably 20 dB or more.

[In a Case of Magnetic Tape Having SUL]

The recording and reproducing characteristics were evaluated as follows. At first, measurement with a so-called drag tester in which by using a single-pole type recording head and a tunnel magnetoresistive (TMR) type reproducing head, recording and reproducing is conducted by reciprocally vibrating the heads with a piezo stage was performed. In a high recording-density recording area exceeding 100 Gb/in$^2$, even with a perpendicular magnetic recording medium, it is difficult to realize sufficient recording and reproducing characteristics mainly due to the problem of recording, and a combination of a single-pole type (SPT) head capable of generating a steep magnetic field in the perpendicular direction and a double-layer perpendicular recording medium having a soft magnetic backing layer (SUL) is required. In addition, it is considered that a tunnel magnetoresistive (TMR) type producing head having a larger magnetoresistance change ratio and a higher reproducing sensitivity as compared with those of a giant magnetoresistive head is also required. For this reason, herein, evaluation by an SPT recording head and a TMR reproducing head was performed. Here, the read track width of the reproducing head was set to 75 nm. Next, the recording wavelength was set to 300 kilo flux changes per inch (kFCI), and the SNR was determined by calculating with a ratio of the zero-to-peak voltage of reproduced waveform to the voltage determined from a value obtained by integrating noise spectra in a band range of 0 kFCI to 600 kFCI.

In general, the minimum SNR required to establish a recording and reproducing system is said to be around 17 dB in a case of the value obtained by the measurement method (so-called broadband SNR) used for the evaluation of recording and reproducing characteristics as described above. In addition, in consideration of the output reduction caused by sliding of a magnetic tape and a magnetic head, or the deterioration of characteristics on practical use, for example, deformation of a magnetic tape, it is desired to further set an SNR margin. In consideration of the margin, it is considered that the SNR is preferably 20 dB or more.

Further, with the magnetic tape in the present Examples, the linear recording density is 600 k bits per inch (BPI), and assuming that the track pit is twice the track width of a reproducing head and considering that the track density is 169 k tracks per inch (TPI), a surface recording density of 600 kBPI×169 kTPI=101 Gb/in$^2$ can be realized.

Table 2A shows constitution of the magnetic tapes of Examples 1 to 19.

TABLE 2A

| | Magnetic layer | | Intermediate layer | | | | Base layer | | | | Vapor deposition conditions | | |
|---|---|---|---|---|---|---|---|---|---|---|---|---|---|
| | | | Upper layer | | Lower layer | | Sputtering conditions | | | | | | Oxygen intro- |
| | | | | | | | Sputtering | | | | | | duction |
| | | Thick-ness | | Thick-ness | | Thick-ness | Thick-ness | gas pressure | Power | Mask angle | Thick-ness | Incident angle | amount |
| | Material | (nm) | Material | (nm) | Material | (nm) | (nm) | (Pa) | (W/mm$^2$) | (deg.) | (nm) | (deg.) | (sccm) |
| Example 1 | CoPtCr—SiO$_2$ | 14 | Ru | 2 | — | — | 50 | 1 | 0.75 | None | — | — | — |
| Example 2 | CoPtCr—SiO$_2$ | 14 | Ru | 2 | — | — | 50 | 1 | 0.75 | None | — | — | — |
| Example 3 | CoPtCr—SiO$_2$ | 14 | Ru | 2 | — | — | 50 | 1 | 0.75 | None | — | — | — |
| Example 4 | CoPtCr—SiO$_2$ | 14 | Ru | 2 | — | — | 50 | 1 | 0.75 | None | — | — | — |
| Example 5 | CoPtCr—SiO$_2$ | 14 | Ru | 2 | — | — | 50 | 1 | 0.75 | None | — | — | — |
| Example 6 | CoPtCr—SiO$_2$ | 14 | Ru | 2 | — | — | 50 | 1 | 0.75 | None | — | — | — |
| Example 7 | CoPtCr—SiO$_2$ | 15 | Ru | 2 | — | — | 50 | 1 | 0.75 | None | — | — | — |
| Example 8 | CoPtCr—SiO$_2$ | 14 | Ru | 2 | — | — | 50 | 1 | 0.75 | None | — | — | — |
| Example 9 | CoPtCr—SiO$_2$ | 14 | Ru | 2 | — | — | — | — | — | — | 50 | 90 | 1000 |
| Example 10 | CoPtCr—SiO$_2$ | 14 | Ru | 2 | — | — | 150 | 1 | 0.75 | None | — | — | — |
| Example 11 | CoPtCr—SiO$_2$ | 14 | Ru | 2 | — | — | 100 | 1 | 0.75 | None | — | — | — |
| Example 12 | CoPtCr—SiO$_2$ | 14 | Ru | 2 | — | — | 50 | 1 | 1.25 | None | — | — | — |
| Example 13 | CoPtCr—SiO$_2$ | 14 | Ru | 2 | — | — | — | — | — | — | 50 | 70 | 1000 |
| Example 14 | CoPtCr—SiO$_2$ | 14 | Ru | 2 | — | — | — | — | — | — | 50 | 60 | 1000 |
| Example 15 | CoPtCr—SiO$_2$ | 14 | Ru | 2 | — | — | 50 | 1 | 0.75 | 70 | — | — | — |
| Example 16 | CoPtCr—SiO$_2$ | 14 | Ru | 2 | — | — | 50 | 1 | 0.75 | 60 | — | — | — |
| Example 17 | CoPtCr—SiO$_2$ | 14 | Ru | 2 | NiW | 10 | 50 | 1 | 0.75 | None | — | — | — |
| Example 18 | CoPtCr—SiO$_2$ | 14 | Ru | 2 | — | — | 50 | 1 | 0.75 | None | — | — | — |
| Example 19 | CoPtCr—SiO$_2$ | 14 | Ru | 2 | — | — | 50 | 1 | 0.75 | None | — | — | — |

Table 2B shows constitution of the magnetic tapes of Examples 1 to 19.

TABLE 2B

| | Seed layer | | | | | Soft magnetic underlayer | | | | |
|---|---|---|---|---|---|---|---|---|---|---|
| | Composition $Cr_X(Ni_Y Fe_{100-Y})_{100-X}$ | | Thickness | Sputtering conditions | | | | SUL (upper layer) thickness | Intermediate layer thickness | SUL (lower layer) thickness |
| | | | | Sputtering gas pressure | Power | | Layer | | | |
| | X | Y | (nm) | (Pa) | (W/mm$^2$) | Material | structure | (nm) | (nm) | (nm) |
| Example 1 | 40 | 81 | 10 | 0.25 | 1.75 | — | — | — | — | — |
| Example 2 | 40 | 81 | 5 | 0.25 | 1.75 | — | — | — | — | — |
| Example 3 | 40 | 81 | 40 | 0.25 | 1.75 | — | — | — | — | — |
| Example 4 | 40 | 60 | 10 | 0.25 | 1.75 | — | — | — | — | — |
| Example 5 | 40 | 70 | 10 | 0.25 | 1.75 | — | — | — | — | — |
| Example 6 | 40 | 90 | 10 | 0.25 | 1.75 | — | — | — | — | — |
| Example 7 | 45 | 81 | 10 | 0.25 | 1.75 | — | — | — | — | — |
| Example 8 | 10 | 81 | 10 | 0.25 | 1.75 | — | — | — | — | — |
| Example 9 | 40 | 81 | 10 | 0.25 | 1.75 | — | — | — | — | — |
| Example 10 | 40 | 81 | 10 | 0.25 | 1.75 | — | — | — | — | — |
| Example 11 | 40 | 81 | 10 | 0.25 | 1.75 | — | — | — | — | — |
| Example 12 | 40 | 81 | 10 | 0.25 | 1.75 | — | — | — | — | — |
| Example 13 | 40 | 81 | 10 | 0.25 | 1.75 | — | — | — | — | — |
| Example 14 | 40 | 81 | 10 | 0.25 | 1.75 | — | — | — | — | — |
| Example 15 | 40 | 81 | 10 | 0.25 | 1.75 | — | — | — | — | — |
| Example 16 | 40 | 81 | 10 | 0.25 | 1.75 | — | — | — | — | — |
| Example 17 | 40 | 81 | 10 | 0.25 | 1.75 | — | — | — | — | — |
| Example 18 | 40 | 81 | 10 | 0.25 | 1.75 | CoZrNb | Single layer | 20 | — | — |
| Example 19 | 40 | 81 | 10 | 0.25 | 1.75 | CoZrNb | Triple layer | 50 | 1.0 | 50 |

Table 20 shows evaluation results of the magnetic tapes of Examples 1 to 19.

TABLE 2C

| | Base layer | | | Seed layer | Magnetic characteristics Perpendicular direction | | Determination index |
|---|---|---|---|---|---|---|---|
| | Concentration ratio of O to Co (oxidation degree) | Column average particle diameter (nm) | Column inclination (°) | X-Ray diffraction intensity ratio (cps/nm) | Hc (Oe) | Rs (%) | SNR (dB) |
| Example 1 | 1.25 | 10 | 90 | 100 | 2800 | 75 | 18 |
| Example 2 | 1.25 | 10 | 90 | 60 | 2600 | 65 | 17 |
| Example 3 | 1.25 | 10 | 90 | 60 | 2700 | 70 | 17.5 |
| Example 4 | 1.25 | 10 | 90 | 60 | 2600 | 65 | 17 |
| Example 5 | 1.25 | 10 | 90 | 80 | 2700 | 70 | 17.5 |
| Example 6 | 1.25 | 10 | 90 | 60 | 2600 | 65 | 17 |
| Example 7 | 1.25 | 10 | 90 | 80 | 2600 | 70 | 18 |
| Example 8 | 1.25 | 10 | 90 | 60 | 2600 | 65 | 17 |
| Example 9 | 1 | 10 | 90 | 100 | 2700 | 70 | 18 |
| Example 10 | 1.25 | 13 | 90 | 100 | 2600 | 85 | 17 |
| Example 11 | 1.25 | 12 | 90 | 100 | 2700 | 83 | 17.5 |
| Example 12 | 1.2 | 13 | 90 | 100 | 2700 | 80 | 17 |
| Example 13 | 1.1 | 8 | 70 | 100 | 3000 | 78 | 18 |
| Example 14 | 1.2 | 6 | 60 | 100 | 3200 | 85 | 19 |
| Example 15 | 1.25 | 8 | 70 | 100 | 3000 | 78 | 18 |
| Example 16 | 1.25 | 6 | 60 | 100 | 3200 | 85 | 19 |
| Example 17 | 1.25 | 10 | 90 | 100 | 2800 | 85 | 19 |
| Example 18 | 1.25 | 10 | 90 | 100 | 2800 | 70 | 20 |
| Example 19 | 1.25 | 10 | 90 | 100 | 2800 | 73 | 22 |

Table 3A shows constitution of the magnetic tapes of Comparative Examples 1 to 15.

TABLE 3A

| | Magnetic layer | | Intermediate layer | | | | Base layer | | | | | Vapor deposition conditions | | |
|---|---|---|---|---|---|---|---|---|---|---|---|---|---|---|
| | | | Upper layer | | Lower layer | | Sputtering conditions | | | | | | | Oxygen intro- duction amount (sccm) |
| | | | | | | | | Sputtering gas pressure (Pa) | Power (W/mm²) | Mask angle (deg.) | | | | |
| | Material | Thickness (nm) | Material | Thickness (nm) | Material | Thickness (nm) | Thickness (nm) | | | | | Thickness (nm) | Incident angle (deg.) | |
| Comparative Example 1 | CoPtCr—SiO₂ | 14 | Ru | 2 | — | — | 50 | 1 | 0.75 | None | | — | — | — |
| Comparative Example 2 | CoPtCr—SiO₂ | 14 | Ru | 2 | — | — | 50 | 1 | 0.75 | None | | — | — | — |
| Comparative Example 3 | CoPtCr—SiO₂ | 14 | Ru | 2 | — | — | 50 | 1 | 0.75 | None | | — | — | — |
| Comparative Example 4 | CoPtCr—SiO₂ | 14 | Ru | 2 | — | — | 50 | 1 | 0.75 | None | | — | — | — |
| Comparative Example 5 | CoPtCr—SiO₂ | 14 | Ru | 2 | — | — | 50 | 1 | 0.75 | None | | — | — | — |
| Comparative Example 6 | CoPtCr—SiO₂ | 14 | Ru | 2 | — | — | 50 | 1 | 0.75 | None | | — | — | — |
| Comparative Example 7 | CoPtCr—SiO₂ | 14 | Ru | 2 | — | — | 50 | 1 | 0.75 | None | | — | — | — |
| Comparative Example 8 | CoPtCr—SiO₂ | 14 | Ru | 2 | — | — | 50 | 1 | 0.75 | None | | — | — | — |
| Comparative Example 9 | CoPtCr—SiO₂ | 14 | Ru | 2 | — | — | 50 | 1 | 0.75 | None | | — | — | — |
| Comparative Example 10 | CoPtCr—SiO₂ | 14 | Ru | 2 | — | — | — | — | — | — | | 50 | 90 | 500 |
| Comparative Example 11 | CoPtCr—SiO₂ | 14 | Ru | 2 | — | — | — | — | — | — | | 50 | 90 | 700 |
| Comparative Example 12 | CoPtCr—SiO₂ | 14 | Ru | 2 | — | — | — | — | — | — | | 50 | 90 | 900 |
| Comparative Example 13 | CoPtCr—SiO₂ | 14 | Ru | 2 | — | — | 160 | 1 | 0.75 | None | | — | — | — |

TABLE 3A-continued

| | Magnetic layer | | Base layer | | | | | | | Vapor deposition conditions | | |
| | | | Intermediate layer | | | | Sputtering conditions | | | | | Oxygen intro- |
| | | | Upper layer | | Lower layer | | Sputtering | | | | | |
| | Material | Thickness (nm) | Material | Thickness (nm) | Material | Thickness (nm) | Thickness (nm) | gas pressure (Pa) | Power (W/mm²) | Mask angle (deg.) | Thickness (nm) | Incident angle (deg.) | duction amount (sccm) |
|---|---|---|---|---|---|---|---|---|---|---|---|---|---|
| Comparative Example 14 | CoPtCr—SiO₂ | 14 | Ru | 2 | — | — | 50 | 0.5 | 0.75 | None | — | — | — |
| Comparative Example 15 | CoPtCr—SiO₂ | 14 | Ru | 2 | — | — | 50 | 1 | 1.5 | None | — | — | — |

Table 3B shows constitution of the magnetic tapes of Comparative Examples 1 to 15.

TABLE 3B

| | Seed layer | | | | | Sort magnetic underlayer | | | | |
| | Composition | | | Sputtering conditions | | | | SUL (upper layer) | Intermediate layer | SUL (lower layer) |
| | Cr$_X$(Ni$_Y$Fe$_{100-Y}$)$_{100-X}$ | | Thickness (nm) | Sputtering gas pressure (Pa) | Power (W/mm²) | Material | Layer structure | thickness (nm) | thickness (nm) | thickness (nm) |
| | X | Y | | | | | | | | |
|---|---|---|---|---|---|---|---|---|---|---|
| Comparative Example 1 | 40 | 81 | 2 | 0.25 | 1.75 | — | — | — | — | — |
| Comparative Example 2 | 40 | 81 | 4 | 0.25 | 1.75 | — | — | — | — | — |
| Comparative Example 3 | 40 | 81 | 45 | 0.25 | 1.75 | — | — | — | — | — |
| Comparative Example 4 | 40 | 81 | 50 | 0.25 | 1.75 | — | — | — | — | — |
| Comparative Example 5 | 40 | 81 | 10 | 1 | 1.75 | — | — | — | — | — |
| Comparative Example 6 | 50 | 81 | 10 | 0.25 | 1.75 | — | — | — | — | — |
| Comparative Example 7 | 5 | 81 | 10 | 0.25 | 1.75 | — | — | — | — | — |
| Comparative Example 8 | 40 | 55 | 10 | 0.25 | 1.75 | — | — | — | — | — |
| Comparative Example 9 | 40 | 95 | 10 | 0.25 | 1.75 | — | — | — | — | — |
| Comparative Example 10 | 40 | 81 | 10 | 0.25 | 1.75 | — | — | — | — | — |
| Comparative Example 11 | 40 | 81 | 10 | 0.25 | 1.75 | — | — | — | — | — |
| Comparative Example 12 | 40 | 81 | 10 | 0.25 | 1.75 | — | — | — | — | — |
| Comparative Example 13 | 40 | 81 | 10 | 0.25 | 1.75 | — | — | — | — | — |
| Comparative Example 14 | 40 | 81 | 10 | 0.25 | 1.75 | — | — | — | — | — |
| Comparative Example 15 | 40 | 81 | 10 | 0.25 | 1.75 | — | — | — | — | — |

Table 30 shows evaluation results of the magnetic tapes of Comparative Examples 1 to 15.

TABLE 3C

| | Base layer | | | Seed layer | Magnetic characteristics | | Determination index |
| | Concentration ratio of O to Co (oxidation degree) | Column average particle diameter (nm) | Column inclination (°) | X-Ray diffraction intensity ratio (cps/nm) | Perpendicular direction | | SNR (dB) |
| | | | | | Hc (Oe) | Rs (%) | |
|---|---|---|---|---|---|---|---|
| Comparative Example 1 | 1.25 | 12 | 90 | 10 | 2000 | 50 | 11 |
| Comparative Example 2 | 1.25 | 12 | 90 | 50 | 2400 | 55 | 15 |

TABLE 3C-continued

|  | Base layer | | | Seed layer | Magnetic characteristics | | Determination index |
|---|---|---|---|---|---|---|---|
|  | Concentration ratio of O to Co (oxidation degree) | Column average particle diameter (nm) | Column inclination (°) | X-Ray diffraction intensity ratio (cps/nm) | Perpendicular direction | | |
|  | | | | | Hc (Oe) | Rs (%) | SNR (dB) |
| Comparative Example 3 | 1.25 | 12 | 90 | 55 | 2600 | 55 | 16 |
| Comparative Example 4 | 1.25 | 12 | 90 | 50 | 2400 | 55 | 15 |
| Comparative Example 5 | 1.25 | 13 | 90 | 50 | 2400 | 55 | 15 |
| Comparative Example 6 | 1.25 | 13 | 90 | 50 | 2400 | 55 | 15 |
| Comparative Example 7 | 1.25 | 12 | 90 | 40 | 2300 | 50 | 14 |
| Comparative Example 8 | 1.25 | 12 | 90 | 50 | 2400 | 60 | 15.5 |
| Comparative Example 9 | 1.25 | 12 | 90 | 50 | 2600 | 55 | 16 |
| Comparative Example 10 | 0.75 | 10 | 90 | 100 | 2200 | 50 | 11 |
| Comparative Example 11 | 0.85 | 10 | 90 | 100 | 2400 | 60 | 12 |
| Comparative Example 12 | 0.9 | 10 | 90 | 100 | 2600 | 60 | 14 |
| Comparative Example 13 | 1.25 | 15 | 90 | 70 | 2500 | 75 | 12 |
| Comparative Example 14 | 1.2 | 16 | 90 | 80 | 2600 | 60 | 14 |
| Comparative Example 15 | 1.2 | 14 | 90 | 90 | 2650 | 60 | 16 |

From the evaluation results described above, the following can be understood.

In Examples 1 to 19, (1) the seed layer contains Cr, Ni, and Fe, the (111) plane of a face-centered cubic structure is preferentially oriented so as to be parallel to a surface of a polymer film as the substrate, and the X-ray diffraction intensity ratio is 60 cps/nm or more. In addition, (2) the base layer contains Co and O, the ratio of the average atomic concentration of O to the average atomic concentration of Co is 1 or more, and a column structure with an average particle diameter of 3 nm or more and 13 nm or less is possessed. For this reason, a favorable perpendicular coercivity Hc and a favorable perpendicular squareness ratio Rs both can be achieved, and thus a favorable SNR is obtained.

In Comparative Examples 1 to 9, (1) the X-ray diffraction intensity ratio is less than 60 cps/nm. For this reason, a favorable perpendicular coercivity Hc and a favorable perpendicular squareness ratio Rs both cannot be achieved, and thus a favorable SNR is not obtained.

In Comparative Examples 10 to 12, (2) the ratio of the average atomic concentration of O to the average atomic concentration of Co is less than 1. For this reason, a favorable perpendicular coercivity Hc and a favorable perpendicular squareness ratio Rs both cannot be achieved, and thus a favorable SNR is not obtained.

In Comparative Examples 10 to 12, (2) the average particle diameter of the column structure is outside the range of 3 nm or more and 13 nm or less. For this reason, a favorable perpendicular coercivity Hc and a favorable perpendicular squareness ratio Rs both cannot be achieved, and thus a favorable SNR is not obtained.

The embodiments and Modification Examples thereof, and Examples, of the present technology have been specifically described above, but the present technology is not limited to the above-described embodiments and Modification Examples thereof, and Examples, and various modifications on the basis of the technical idea of the present technology can be accepted.

For example, the configurations, methods, processes, shapes, materials, numerical values, and the like, which are mentioned in the above-described embodiments and Modification Examples thereof, and Examples, are merely examples, and different configurations, methods, processes, shapes, materials, numerical values, and the like may be used as needed.

In addition, the configurations, methods, processes, shapes, materials, numerical values, and the like, in the above-described embodiments and Modification Examples thereof, and Examples may be combined with each other as long as they do not depart from the gist of the present technology.

Further, the present technology may adopt the following configurations.

(1)

A magnetic recording medium, including:

an elongated substrate having flexibility;

a first layer, being provided on the substrate, containing Cr, Ni, and Fe, and having a face-centered cubic lattice structure with a (111) plane preferentially oriented so as to be parallel to a surface of the substrate;

a second layer, being provided on the first layer, containing Co and O, having a ratio of an average atomic concentration of O to an average atomic concentration of Co of 1 or more, and having a column structure with an average particle diameter of 3 nm or more and 13 nm or less;

a third layer, being provided on the second layer, and containing Ru; and a perpendicular recording layer, being provided on the third layer.

(2)

The magnetic recording medium according (1), in which the magnetic recording medium has an X-ray diffraction intensity ratio of 60 cps/nm or more in the first layer.

(3)

The magnetic recording medium according to (1) or (2), in which the Cr, Ni, and Fe contained in the first layer have an average composition represented by following formula (A):

$$Cr_X(Ni_YFe_{100-Y})_{100-X} \quad (A)$$

(where X is in a range of $10 \leq X \leq 45$, and Y is in a range of $60 \leq Y \leq 90$).

(4)

The magnetic recording medium according to any one of (1) to (3), in which the first layer has a thickness of 5 nm or more and 40 nm or less.

(5)

The magnetic recording medium according to any one of (1) to (4), in which the second layer has a thickness of 10 nm or more and 150 nm or less.

(6)

The magnetic recording medium according to any one of (1) to (5), in which the column structure has an inclination angle of 60° or more and 90° or less.

(7)

The magnetic recording medium according to any one of (1) to (6), further including a soft magnetic layer being provided between the substrate and the first layer.

(8)

The magnetic recording medium according to (7), in which the soft magnetic layer is provided with a first soft magnetic layer, an intermediate layer, and a second soft magnetic layer.

(9)

The magnetic recording medium according to any one of (1) to (8), in which the perpendicular recording layer has a granular structure, and particles containing Co, Pt, and Cr are separated by an oxide in the granular structure.

(10)

The magnetic recording medium according to any one of (1) to (9), further including a lubricant layer containing at least one kind of a carboxylic acid-based compound represented by following general formula (1), General formula (1):

[Chemical formula 1]

(where Rf is an unsubstituted or substituted, or saturated or unsaturated, fluorine-containing hydrocarbon group or hydrocarbon group, Es is an ester bond, and R may not be present, or is an unsubstituted or substituted, or saturated or unsaturated hydrocarbon group).

(11)

The magnetic recording medium according to any one of (1) to (9), further including a lubricant layer containing one of both of carboxylic acid compounds represented by following general formulas (2) and (3), General formula (2):

[Chemical formula 2]

(where Rf is an unsubstituted or substituted, or saturated or unsaturated, fluorine-containing hydrocarbon group or hydrocarbon group), and General formula (3):

[Chemical formula 3]

(where Rf is an unsubstituted or substituted, or saturated or unsaturated, fluorine-containing hydrocarbon group or hydrocarbon group).

(12)

The magnetic recording medium according to (11), in which

Rf is a saturated or unsaturated fluorine-containing hydrocarbon having 6 to 50 carbon atoms in total and having 4 to 20 carbon atoms of fluorinated hydrocarbon groups in total.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

10 Magnetic recording medium
11 Substrate
12 Seed layer
13 Base layer
14, 31 Intermediate layer
15 Recording layer
16 Protective layer
17 Lubricant layer
18 Back coat layer
20 Sputtering device
21 Film-forming chamber
22 Drum
23a, 23b, 23c Cathode
24 Supply reel
25 Take-up reel
31a First intermediate layer
31b Second intermediate layer
32 SUL
33 APC-SUL
33a, 33c Soft magnetic layer
33b Intermediate layer

The invention claimed is:
1. A magnetic recording medium, comprising:
an elongated substrate having flexibility;
a first layer, being provided on the substrate, containing Cr, Ni, and Fe, and having a face-centered cubic lattice structure with a (111) plane preferentially oriented so as to be parallel to a surface of the substrate;
a second layer, being provided on the first layer, containing Co and O, having a ratio of an average atomic concentration of O to an average atomic concentration of Co of 1 or more, and having a column structure with an average particle diameter of 3 nm or more and 13 nm or less;
a third layer, being provided on the second layer, and containing Ru; and
a perpendicular recording layer, being provided on the third layer.
2. The magnetic recording medium according to claim 1, wherein
the magnetic recording medium has an X-ray diffraction intensity ratio of 60 cps/nm or more in the first layer.
3. The magnetic recording medium according to claim 1, wherein the Cr, Ni, and Fe contained in the first layer have an average composition represented by following formula (A):

$$Cr_X(Ni_YFe_{100-Y})_{100-X} \quad (A)$$

(where X is in a range of $10 \leq X \leq 45$, and Y is in a range of $60 \leq Y \leq 90$).

4. The magnetic recording medium according to claim 1, wherein
the first layer has a thickness of 5 nm or more and 40 nm or less.

5. The magnetic recording medium according to claim 1, wherein
the second layer has a thickness of 10 nm or more and 150 nm or less.

6. The magnetic recording medium according to claim 1, wherein
the column structure has an inclination angle of 60° or less.

7. The magnetic recording medium according to claim 1, further comprising
a soft magnetic layer being provided between the substrate and the first layer.

8. The magnetic recording medium according to claim 7, wherein
the soft magnetic layer is provided with a first soft magnetic layer, an intermediate layer, and a second soft magnetic layer.

9. The magnetic recording medium according to claim 1, wherein
the perpendicular recording layer has a granular structure, and particles containing Co, Pt, and Cr are separated by an oxide in the granular structure.

10. The magnetic recording medium according to claim 1, further comprising
a lubricant layer containing at least one kind of a carboxylic acid-based compound represented by following general formula (1), General formula (1):

[Chemical formula 1]

(where Rf is an unsubstituted or substituted, or saturated or unsaturated, fluorine-containing hydrocarbon group or hydrocarbon group, Es is an ester bond, and R may not be present, or is an unsubstituted or substituted, or saturated or unsaturated hydrocarbon group).

11. The magnetic recording medium according to claim 1, further comprising
a lubricant layer containing one or both of carboxylic acid compounds represented by following general formulas (2) and (3),

General formula (2):

[Chemical formula 2]

(where Rf is an unsubstituted or substituted, or saturated or unsaturated, fluorine-containing hydrocarbon group or hydrocarbon group), and General formula (3):

[Chemical formula 3]

(where Rf is an unsubstituted or substituted, or saturated or unsaturated, fluorine-containing hydrocarbon group or hydrocarbon group).

12. The magnetic recording medium according to claim 11, wherein
Rf is a saturated or unsaturated fluorine-containing hydrocarbon having 6 to 50 carbon atoms in total and having 4 to 20 carbon atoms of fluorinated hydrocarbon groups in total.

* * * * *